US012572178B2

(12) United States Patent (10) Patent No.: US 12,572,178 B2
Wu et al. (45) Date of Patent: Mar. 10, 2026

(54) ELECTRONIC DEVICE

(71) Applicant: InnoLux Corporation, Miao-Li County (TW)

(72) Inventors: Yuan-Lin Wu, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 19/026,522

(22) Filed: Jan. 17, 2025

(65) Prior Publication Data

US 2025/0155932 A1 May 15, 2025

Related U.S. Application Data

(63) Continuation of application No. 18/516,983, filed on Nov. 22, 2023, now Pat. No. 12,228,974, which is a continuation of application No. 17/985,108, filed on Nov. 10, 2022, now Pat. No. 11,860,696, which is a continuation of application No. 17/382,339, filed on Jul. 22, 2021, now Pat. No. 11,520,379, which is a (Continued)

(51) Int. Cl.
| | |
|---|---|
| *G06F 3/045* | (2006.01) |
| *G06F 1/16* | (2006.01) |
| *G06F 3/041* | (2006.01) |
| *G06F 3/044* | (2006.01) |
| *G06V 10/147* | (2022.01) |
| *G06V 40/13* | (2022.01) |
| *H10K 59/65* | (2023.01) |
| *H10K 59/12* | (2023.01) |

(52) U.S. Cl.
CPC .......... *G06F 1/1652* (2013.01); *G06F 3/0416* (2013.01); *G06F 3/044* (2013.01); *G06V 10/147* (2022.01); *G06V 40/1306* (2022.01); *H10K 59/65* (2023.02); *H10K 59/12* (2023.02)

(58) Field of Classification Search
CPC .... G06F 1/1652; G06F 1/1684; G06F 3/0416; G06F 3/044; G06F 21/32; G06F 2203/04102; G06F 2203/04106; G09F 9/301; H10K 77/11; H10K 2102/311
See application file for complete search history.

(56) References Cited

U.S. PATENT DOCUMENTS

| | | | | |
|---|---|---|---|---|
| 8,654,177 B2 * | 2/2014 | Kim | ........................ | H04N 23/51 |
| | | | | 348/335 |
| 9,229,481 B2 * | 1/2016 | Jinbo | .................... | G06F 1/1677 |

(Continued)

*Primary Examiner* — Joe H Cheng
(74) *Attorney, Agent, or Firm* — Winston Hsu

(57) ABSTRACT

An electronic device has a first region and a second region and includes a supporting film having an opening disposed in the first region, a flexible substrate, an integrated circuit unit, and a sensing structure electrically connected to the integrated circuit unit. At least a portion of the flexible substrate and the integrated circuit unit respectively correspond to opposite sides of the supporting film. In a sectional view of the electronic device, the sensing structure includes a plurality of conductive lines, a distance between two adjacent ones of the plurality of conductive lines in the first region is different from a distance between other two adjacent ones of the plurality of conductive lines in the second region, and the two adjacent ones of the plurality of conductive lines are overlapped with the opening of the supporting film.

7 Claims, 14 Drawing Sheets

Related U.S. Application Data continuation of application No. 16/836,771, filed on Mar. 31, 2020, now Pat. No. 11,093,004, which is a continuation of application No. 16/218,488, filed on Dec. 13, 2018, now Pat. No. 10,642,313.

(56) References Cited

U.S. PATENT DOCUMENTS

| | | | | |
|---|---|---|---|---|
| 9,710,033 | B2 * | 7/2017 | Yamazaki | G09G 3/3225 |
| 9,927,839 | B2 * | 3/2018 | Kummer | G06F 1/1641 |
| 10,367,173 | B1 * | 7/2019 | Wu | H10K 59/873 |
| 10,379,573 | B2 * | 8/2019 | Park | G06F 3/0487 |
| 10,416,719 | B2 * | 9/2019 | Chun | G06F 3/147 |
| 10,642,313 | B1 * | 5/2020 | Wu | H10K 59/65 |
| 10,707,194 | B2 * | 7/2020 | Odaka | H10K 59/871 |
| 11,093,004 | B2 * | 8/2021 | Wu | H10K 59/65 |
| 11,520,379 | B2 * | 12/2022 | Wu | H10K 59/65 |
| 11,860,696 | B2 * | 1/2024 | Wu | G06V 10/147 |
| 2003/0071896 | A1 * | 4/2003 | Hunter | G08B 13/19643 |
| | | | | 348/E7.086 |
| 2010/0058205 | A1 * | 3/2010 | Vakil | G06F 1/1647 |
| | | | | 715/761 |
| 2011/0216064 | A1 * | 9/2011 | Dahl | H04M 1/0247 |
| | | | | 345/428 |
| 2012/0025168 | A1 * | 2/2012 | Wallis | H10D 30/4735 |
| | | | | 257/18 |
| 2012/0066591 | A1 * | 3/2012 | Hackwell | G06F 3/0483 |
| | | | | 715/702 |
| 2012/0280924 | A1 * | 11/2012 | Kummer | G06F 1/1641 |
| | | | | 345/173 |
| 2014/0218327 | A1 * | 8/2014 | Shi | G06V 40/1318 |
| | | | | 345/174 |
| 2014/0285476 | A1 * | 9/2014 | Cho | H04M 1/0247 |
| | | | | 345/204 |
| 2014/0300574 | A1 * | 10/2014 | Benkley, III | G06F 3/041661 |
| | | | | 345/174 |
| 2014/0362513 | A1 * | 12/2014 | Nurmi | G06F 1/1656 |
| | | | | 29/401.1 |
| 2015/0036300 | A1 * | 2/2015 | Park | H05K 1/147 |
| | | | | 156/212 |
| 2015/0227271 | A1 * | 8/2015 | Kang | G06F 1/1641 |
| | | | | 715/781 |
| 2016/0026381 | A1 * | 1/2016 | Kim | G06F 3/04817 |
| | | | | 715/761 |
| 2016/0132074 | A1 * | 5/2016 | Kim | G06F 1/1652 |
| | | | | 345/173 |
| 2016/0291642 | A1 * | 10/2016 | Kwak | G06F 3/04886 |
| 2016/0381014 | A1 * | 12/2016 | Kim | G06F 1/1652 |
| | | | | 726/7 |
| 2017/0003793 | A1 * | 1/2017 | Gao | G06F 1/1681 |
| 2017/0076079 | A1 * | 3/2017 | Ran | G06F 3/04883 |
| 2018/0089485 | A1 * | 3/2018 | Bok | G06F 1/1684 |
| 2018/0157361 | A1 * | 6/2018 | Kim | G06F 3/0443 |
| 2018/0196989 | A1 * | 7/2018 | Hong | G06V 40/1365 |
| 2020/0034643 | A1 * | 1/2020 | Lius | G06F 3/041 |
| 2020/0089933 | A1 * | 3/2020 | Lius | G06F 1/1684 |
| 2020/0133335 | A1 * | 4/2020 | Wu | H04M 1/0268 |

* cited by examiner

ELECTRONIC DEVICE

CROSS REFERENCE TO RELATED APPLICATIONS

This application is a continuation application of U.S. application Ser. No. 18/516,983, filed on Nov. 22, 2023, now U.S. Pat. No. 12,228,974 B2, which is a continuation application of U.S. application Ser. No. 17/985,108, filed on Nov. 10, 2022, now U.S. Pat. No. 11,860,696 B2, which is a continuation application of U.S. application Ser. No. 17/382,339, filed on Jul. 22, 2021, now U.S. Pat. No. 11,520,379 B2, which is a continuation application of U.S. application Ser. No. 16/836,771, filed on Mar. 31, 2020, now U.S. Pat. No. 11,096,004 B2, which is a continuation application of U.S. application Ser. No. 16/218,488, filed on Dec. 13, 2018 now U.S. Pat. No. 10,642,313 B2. The contents of these applications are incorporated herein by reference.

BACKGROUND OF THE DISCLOSURE

1. Field of the Disclosure

The present disclosure is related to a foldable display device and an operation method of related electronic device, and more particular to a foldable display device including a biometric sensing structure and related electronic device.

2. Description of the Prior Art

In recent years, foldable electronic device has become one of next generation technologies. The foldable electronic device offers portability when in a folded state and expands into a relatively large sized display when in an unfolded state, and accordingly, the foldable electronic device may have various applications in electronic displays used in televisions, monitors, mobile computing devices, such as smartphones, tablet computers, mobile personal computers (PCs), and electronic book readers, and wearable devices, such as smart watches. For this reason, the foldable electronic device may store a lot of information including personal private information. For securing the private information, biometric recognition is developed. However, in the conventional technique, only a small amount of biometric sensors may be integrated in the electronic device, and therefore the sensing area is limited and may be restricted within a small certain region. The limited amount and/or disposition area of the biometric sensor restricts the use and the security application in the conventional foldable electronic devices. As a result, the protection of information with different security level stored in the electronic device is limited, and to increase access restriction approach is still in need.

SUMMARY OF THE DISCLOSURE

One of the objectives of the present disclosure is to provide a foldable electronic device and related operation method, wherein the foldable electronic device includes a biometric sensing structure.

In one embodiment, an electronic device provided by the present disclosure has a first region and a second region and includes a supporting film having an opening disposed in the first region, a flexible substrate, an integrated circuit unit, and a sensing structure electrically connected to the integrated circuit unit. At least a portion of the flexible substrate and the integrated circuit unit respectively correspond to opposite sides of the supporting film. In a sectional view of the electronic device, the sensing structure includes a plurality of conductive lines, a distance between two adjacent ones of the plurality of conductive lines in the first region is different from a distance between other two adjacent ones of the plurality of conductive lines in the second region, and the two adjacent ones of the plurality of conductive lines are overlapped with the opening of the supporting film.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

It should be noted that the technical features in different embodiments described in the following can be replaced, recombined, or mixed with one another to constitute another embodiment without departing from the spirit of the present disclosure.

Figure 1:
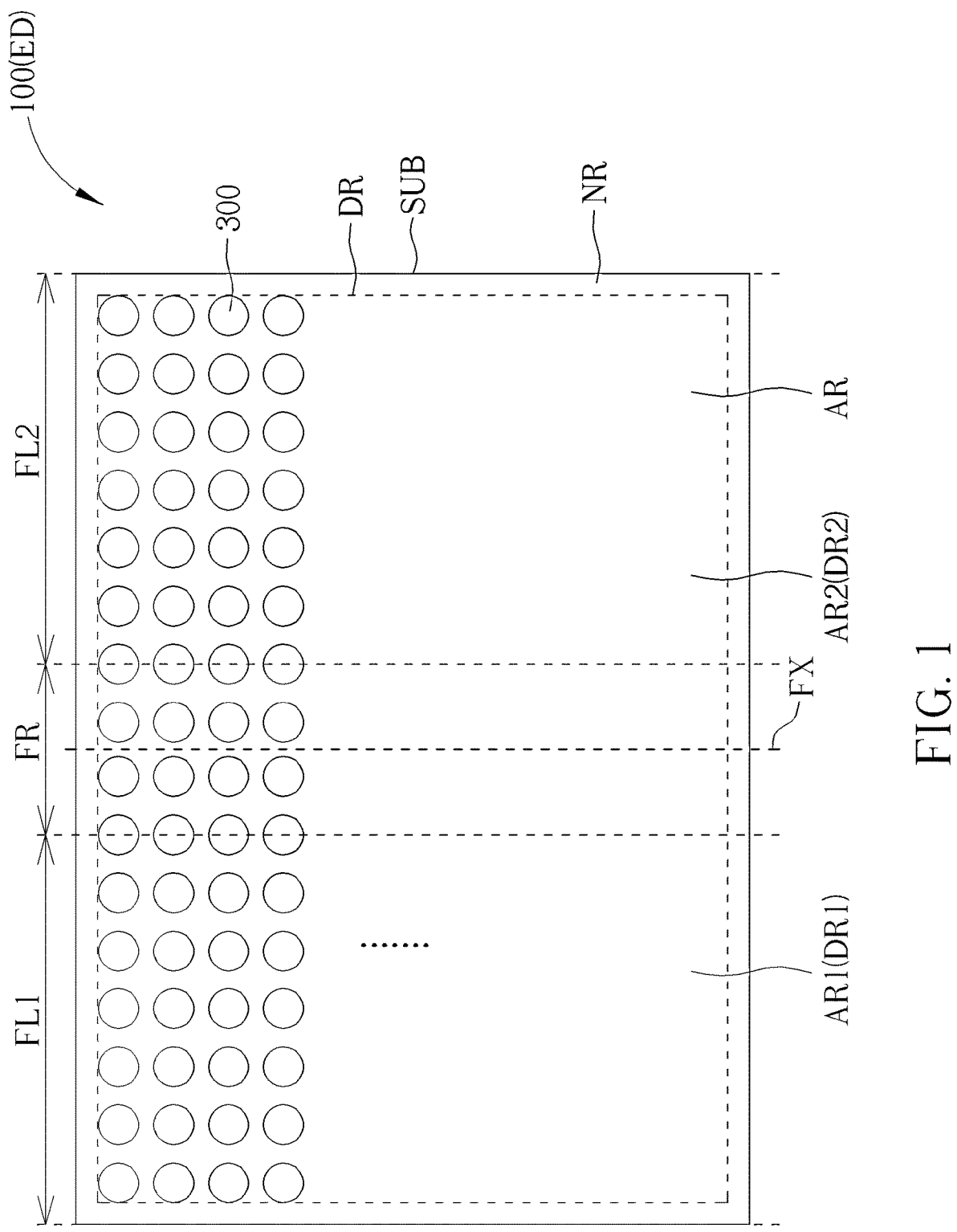
FIG. 1 is a schematic diagram of a top view of an electronic device according to a first embodiment of the present disclosure.
Figure 2:
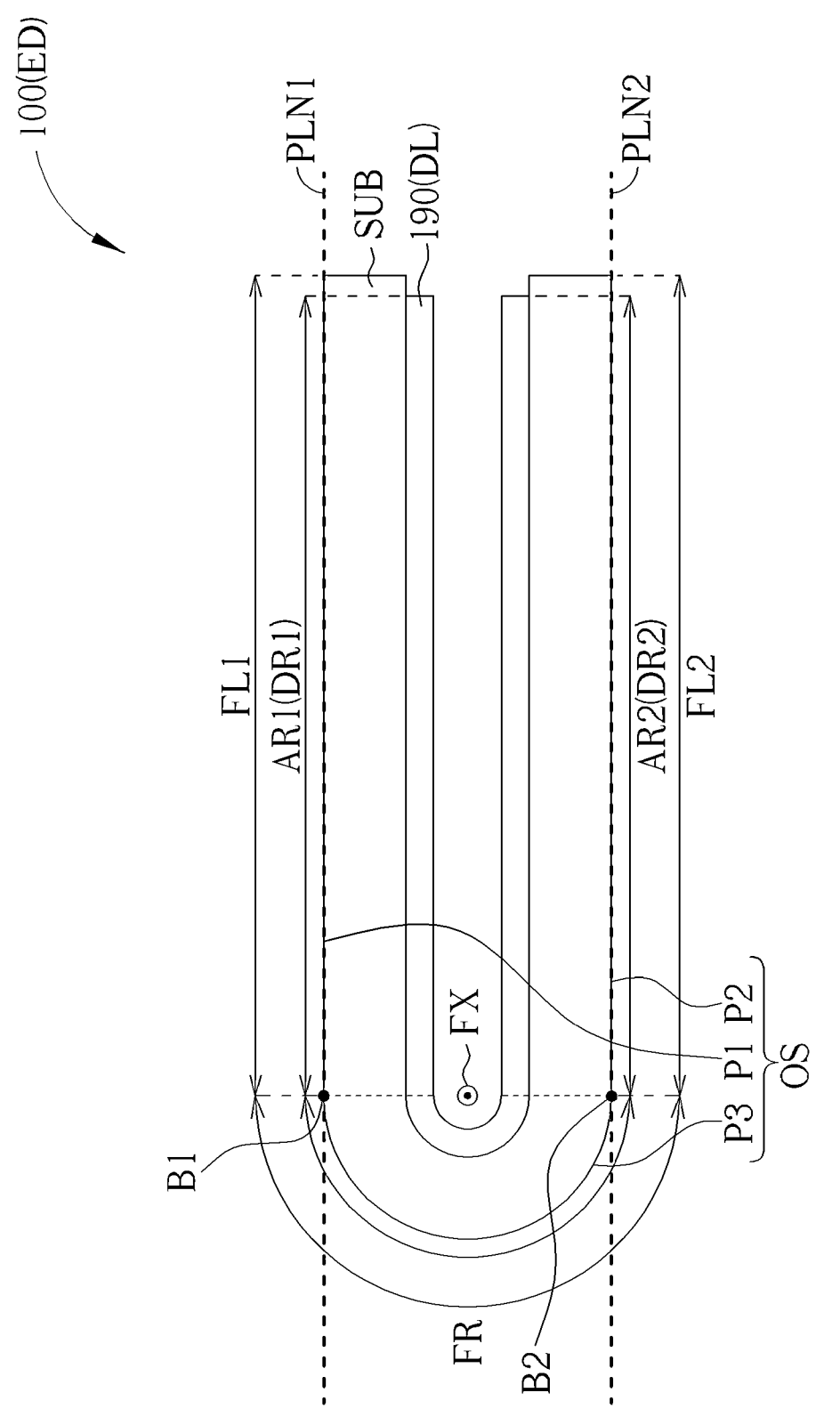
FIG. 2 is a schematic diagram of a sectional view of the electronic device shown in FIG. 1.
Figure 3:
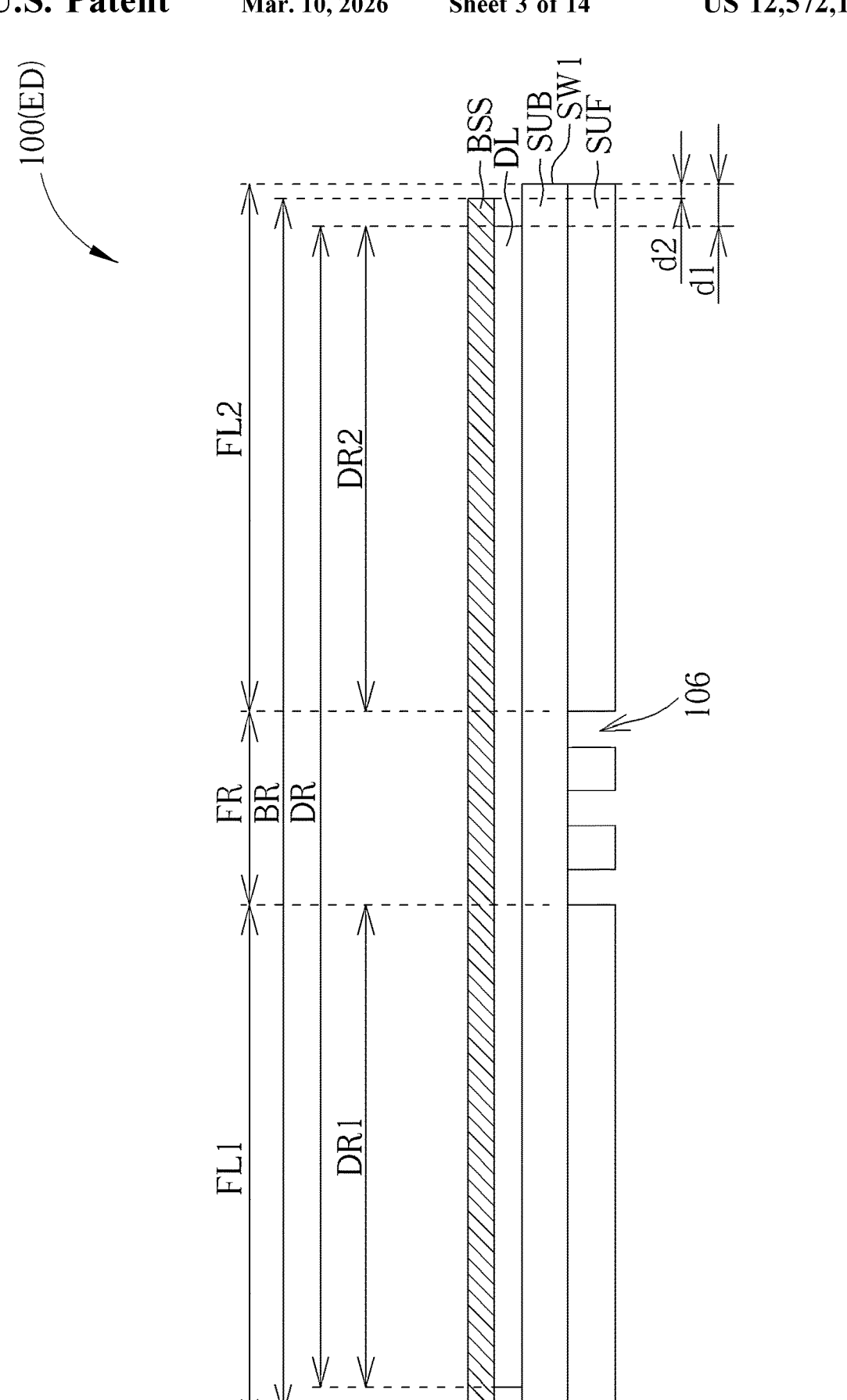
FIG. 3 is a schematic diagram of a sectional view with more details of the electronic device shown in FIG. 1.
Figure 4:
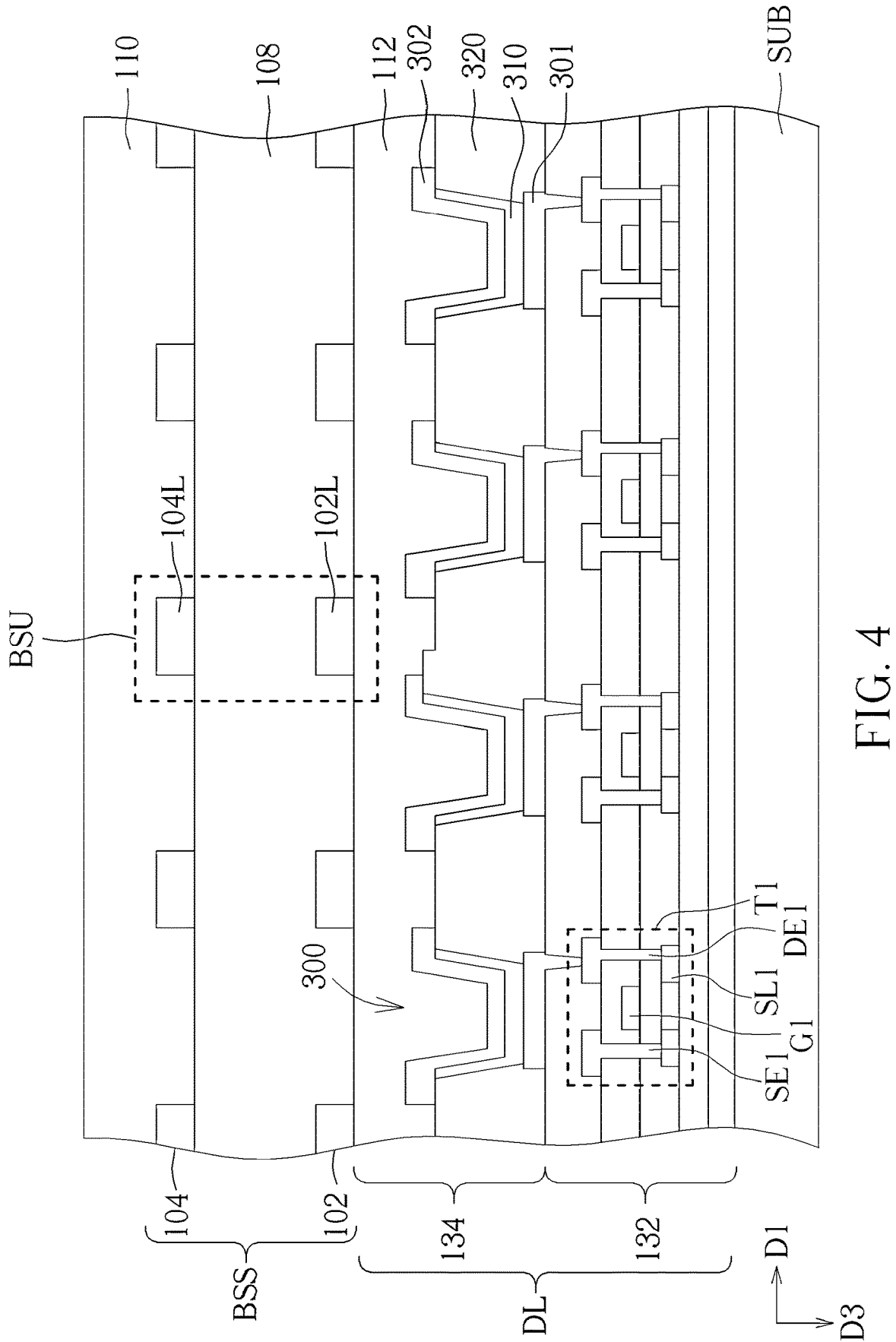
FIG. 4 is a partial-enlargement schematic diagram of a sectional view of the electronic device shown in FIG. 1.
Figure 5:
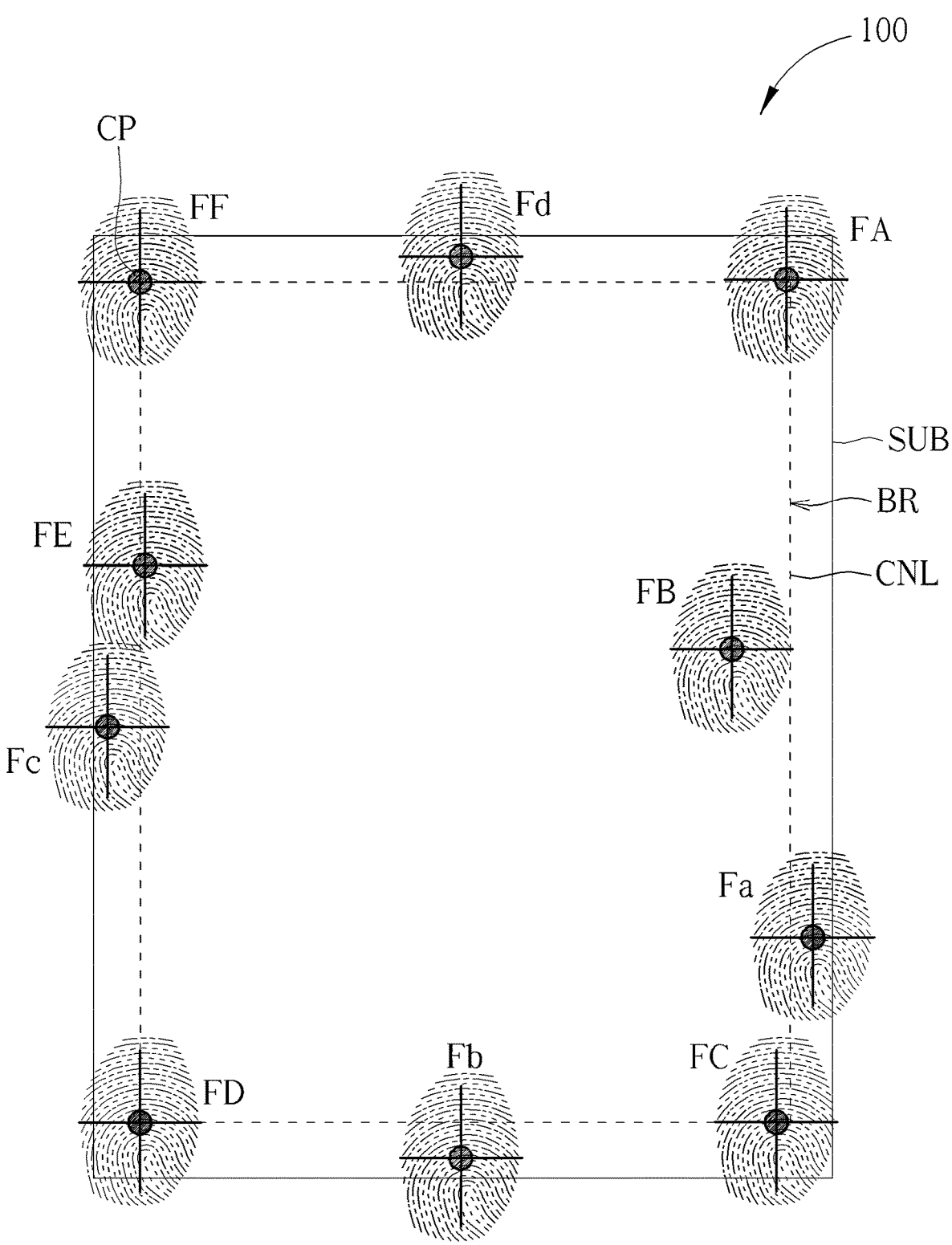
FIG. 5 is a schematic diagram illustrating the biometric sensing region of the electronic device shown in FIG. 1.
Figure 6:
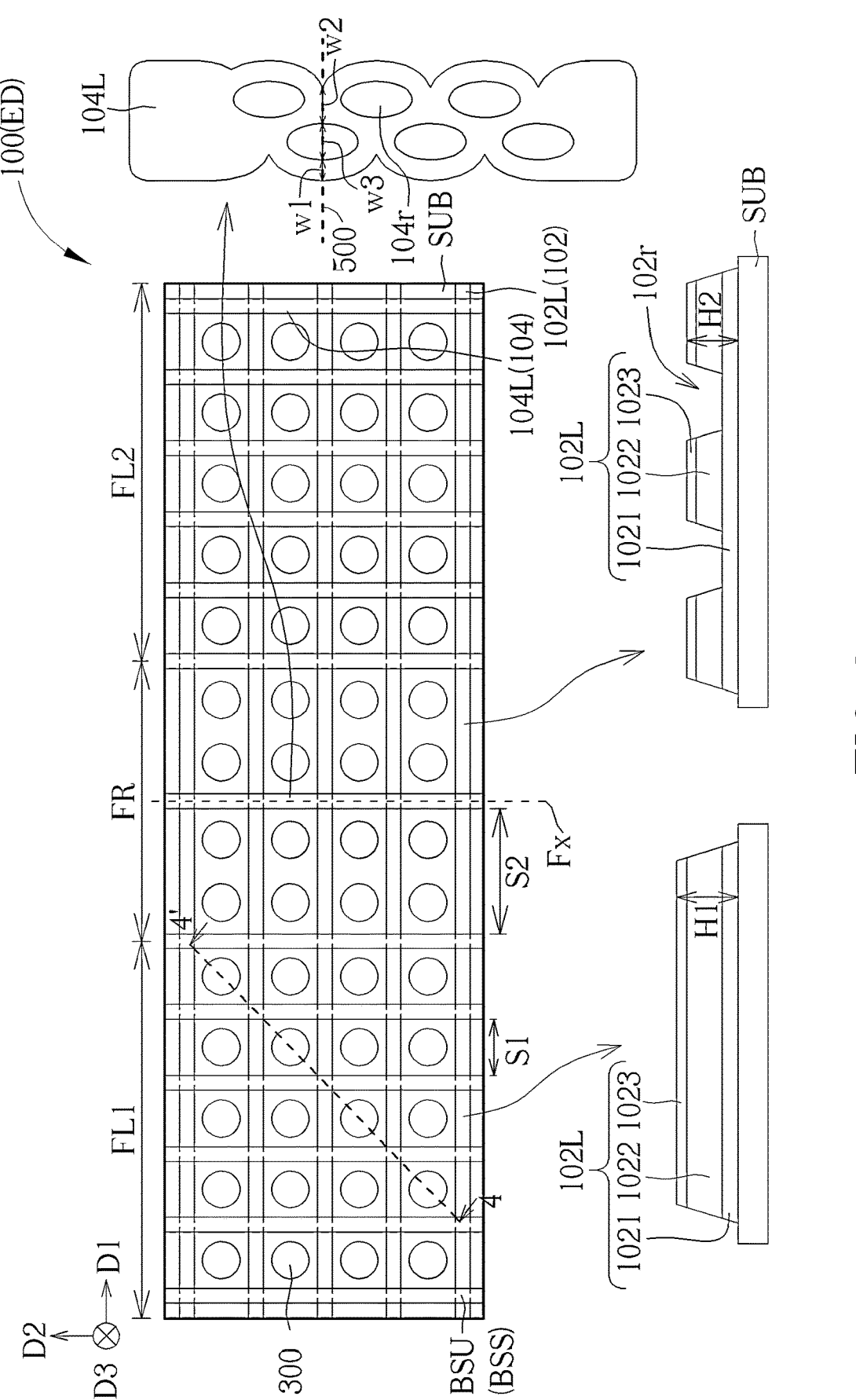
FIG. 6 is a schematic diagram of a top view of an electronic device according to a first embodiment of the present disclosure.

Referring to FIG. 1 to FIG. 6, FIG. 1 is a schematic diagram of a top view of an electronic device according to a first embodiment of the present disclosure, FIG. 2 is a schematic diagram of a sectional view of the electronic device shown in FIG. 1, FIG. 3 is a schematic diagram of a sectional view with more details of the electronic device shown in FIG. 1, FIG. 4 is a partial-enlargement schematic diagram of a sectional view of the electronic device shown in FIG. 1, FIG. 5 is a schematic diagram illustrating the biometric sensing region of the electronic device shown in FIG. 1, and FIG. 6 is a schematic diagram of a top view of the electronic device according to the first embodiment of the present disclosure, which shows the arrangement of the display units and the biometric sensing structure.

As shown in FIG. 1 and FIG. 2, the electronic device ED of the present disclosure can be a foldable electronic device ED, which can be folded along a folding axis FX between 180° to −180°. For example, the foldable electronic device ED in FIG. 2 shows the inwardly folding state and the folding angle is 180°. The foldable electronic device ED includes a first flat region FL1, a second flat region FL2, and a foldable region FR connecting the first flat region FL1 and the second flat region FL2. The foldable electronic device ED in the foldable region FR is capable of being curved, bent, and/or folded. In some embodiments, the foldable electronic device ED can include more than one foldable region FR. In addition, the electronic device ED can be divided into an active region AR and a non-active region NR adjacent to, for example, surrounding the active region AR. The active region AR can include a first active region AR1 in the first flat region FL1, a second active region AR2 in the second flat region FL2, and the foldable region FR.

Referring to FIG. 2, the foldable electronic device ED of the present disclosure can include a flexible substrate SUB, and an electronic layer 190 disposed on the flexible substrate SUB. According to some embodiments, the electronic layer 190 can be a display layer DL. According to some embodiments, the electronic layer 190 can have no display function; for example, can include an antenna, for example a liquid crystal antenna. In such situation, the electronic layer 190 may include a medium layer and a circuit layer. The medium layer can be a liquid crystal layer or other suitable medium materials, the circuit layer can be fabricated by thin film processes, and can optionally include switches (ex. TFTs), and thus the foldable electronic device ED can be a foldable antenna, for example a foldable liquid crystal antenna. For example, the electronic layer 190 can include a plurality of antenna units disposed in the active region. Electromagnetic wave can be emitted from or received by the antenna units.

The foldable electronic device ED has an outer surface OS, which includes a first surface part P1 defining the first flat region FL1, a second surface part P2 defining the second flat region FL2, and a third surface part P3 defining the foldable region FR. When the foldable electronic device ED is expanded to an unfolded state, the first surface part P1, the second surface part P2 and the third surface part P3 are in level with the same plane. When the foldable electronic device ED is folded to an folded state as shown in FIG. 2, the first surface part P1 is flat and in level with a plane PLN1, the second surface part P2 is flat and in level with another plane PLN2, and the third surface part P3 is bent and not in level with the above-mentioned planes. Accordingly, when the foldable electronic device ED is at the folded state, the third surface part P3 can be defined between the plane PLN1 and the plane PLN2. In detail, a first boundary B1 is defined at a position departing away from the first surface part P1, and a second boundary B2 is defined at a position departing away from the second surface part P2. In other words, the foldable region FR can be defined by a region between the first boundary B1 and the second boundary B2.

According to some embodiments, the electronic layer 190 can be a display layer DL. For easy explanation, some examples are taken when the foldable electronic device ED is the foldable display device 100 in the following embodiments when the electronic layer 190 is a display layer DL. The display layer DL can be disposed in a display region DR and include a plurality of display units 300. For example, as shown in FIG. 4, the display units 300 can be OLED units. Thus, the foldable electronic device ED is a foldable display device 100, and the active region AR is the display region DR. Referring to FIG. 1, thus, the display region DR can include a first display region DR1 located in the first flat region FL1, a second display region DR2 located in the second flat region FL2, and the foldable region FR. The foldable region FR connects the first display region DR1 and the second display region DR2. FIG. 1 shows the top view when the foldable display device 100 is turned on and display image. The display region DR can be defined by connecting outer sides of the outmost display units 300, for example, by connecting outer sides of the light emitting regions of outmost display units 300. In some embodiments, as shown in FIG. 1, the display units 300 can be disposed in the foldable region FR. Alternatively, in some embodiments, none of the display units 300 may be disposed in the foldable region FR.

The foldable display device 100 can n include a flexible substrate SUB, a display layer DL disposed on the flexible substrate SUB, and a biometric sensing structure BSS (shown in FIG. 3 and FIG. 4, but omitted in FIG. 1 and FIG. 2) disposed in the first display region DR1, the second display region DR2, and the foldable region FR. The biometric sensing structure BSS can include a capacitive-type sensing structure, an optical-type sensing structure, an ultrasonic type sensing structure, or a combination thereof.

The flexible substrate SUB may be a plastic substrate, for example, a polyimide (PI) substrate, a polycarbonate (PC) substrate or a polyethylene terephthalate (PET) substrate, but not limited thereto. The display layer DL can include multiple layers. According to some embodiments, the display layer DL can include signal lines, thin film transistors, display units, insulating layers and/or circuits, which can be used for controlling display image. Display units can include any suitable display elements, such as organic light emitting diodes (OLEDs), micro LEDs (light-emitting diodes), mini LEDs, quantum dot LEDs, or a liquid crystal layer. In some embodiments, the chip size of a mini-LED can be in a range from 100 μm to 300 μm. In an embodiment, the chip size of a micro-LED can be in a range from 1 μm to 100 μm.

FIG. 4 shows a detailed structure of the display layer DL and the biometric sensing structure BSS. The display layer DL may include a circuit layer 132 and a light emitting structure 134 disposed on the circuit layer 132. The light emitting structure 134 can include a plurality of display units 300. The circuit layer 132 may include driving elements and/or switch elements for driving the display units 300. For example, the circuit layer 132 includes a plurality of driving elements (such as thin film transistors, TFT) electrically connected to and driving the corresponding display units 300. The thin film transistor used for driving the display units 300 are represented as driving TFT T1 hereinafter. Each driving TFT T1 may include a source electrode SE1, a drain electrode DE1, a gate electrode G1, and a semiconductor layer SL1 and may be electrically connected to the bottom electrode of the corresponding display unit 300. The display units 300 can be organic light-emitting diode (OLED) in this embodiment.

For example, as shown in FIG. 4, one display unit 300 can include a first electrode 301 (which may serve as the bottom electrode electrically connected to the thin film transistor), a second electrode 302 (which may serve as the top electrode), and a light emitting layer 310 disposed between the first electrode 301 and the second electrode 302. The first electrode 301 may be an anode and the second electrode 302 may be a cathode, but not limited thereto. The light emitting region of each display unit 300 can be defined by a dielectric layer 320, which may serve as a pixel defining layer (PDL). The light emitting layer 310 may include one or more layers of emissive material, and can be organic material. Different display units 300 can emit lights with different colors, such as red, green and blue colors. For example, the light emitting layer 310 in different display units 300 can be made of different materials for emitting light of red, green, and blue. The first electrode 301 and the second electrode 302 may include metal or transparent conductive material, but not limited thereto. Examples of the metal material of the electrodes may include Mg, Ca, Al, Ag, W, Cu, Ni, Cr, or an alloy of one or more of the above-mentioned material. Examples of the transparent conductive material may include indium tin oxide (ITO), indium zinc oxide (IZO), zinc oxide, or indium oxide.

The biometric sensing structure BSS can detect or identify the biometric characteristics, such as fingerprint, palm print, face feature, or iris feature, but not limited thereto. As an example, the biometric sensing structure BSS can detect fingerprint in this embodiment. Referring to FIG. 4, the biometric sensing structure BSS of this embodiment is a capacitive-type sensing structure and is disposed on the display layer DL. In other words, the display layer DL is disposed between the biometric sensing structure BSS and the flexible substrate SUB in this embodiment. The capacitive-type biometric sensing structure BSS may include a first conductive layer 102, a second conductive layer 104 disposed on the first conductive layer 102, and a dielectric layer 108 disposed between the first conductive layer 102 and the second conductive layer 104. Another dielectric layer or a protection layer 110 may cover the second conductive layer 104. Referring to FIG. 4 and FIG. 6, in which FIG. 4 shows a sectional view along the cross-line 4-4' shown in FIG. 6, the first conductive layer 102 includes a plurality of first conductive lines 102L extending along a direction D1 parallel to the surface of the flexible substrate SUB, and the second conductive layer 104 includes a plurality of second conductive lines 104L extending along another direction D2 parallel to the surface of the flexible substrate SUB. The direction D1 and the direction D2 can be different, and can be perpendicular. The direction D1 may be perpendicular to the folding axis FX, and the direction D2 may be parallel to the folding axis FX. In some embodiments, the first conductive lines 102L and the second conductive lines 104L can be in a linear shape (as shown in FIG. 6). In some embodiments, the first conductive lines 102L and the second conductive lines 104L can be in a non-linear shape, for example, a wavy shape or a zigzag shape, or can include a curved shape. Thus, the plurality of first conductive lines 102L and the plurality of second conductive lines 104L intersect each other to form a plurality of sensing units BSU. The biometric sensing structure BSS includes a plurality of sensing units BSU, which is formed at the overlapping portion of the first conductive lines 102L and the second conductive lines 104L. In other words, one sensing unit BSU is defined by an overlapping portion of one first conductive line 102L and one second conductive line 104L, together with the dielectric layer 108 corresponding to the overlapping portion. In this embodiment, the sensing units BSU may be disposed between two display units 300 respectively and do not cover the light-emitting region of the display units 300.

Referring to FIG. 3, the biometric sensing structure BSS has a biometric sensing region BR, and a first ratio of an area of the biometric sensing region BR to an area of the flexible substrate SUB is in a range from 0.6 to 1. Since the display region DR is smaller than the flexible substrate SUB, a second ratio of an area of the biometric sensing region BR to an area of the display region DR may be greater than the first ratio and may be greater than 0.6 or even greater than 1. In some embodiments, the area of the display region DR is smaller than the area of the biometric sensing region BR, as shown in FIG. 3. A minimum distance d1 between the boundary of the display region DR of the display layer DL and an edge SW1 of the flexible substrate SUB is greater than a minimum distance d2 between the boundary of the biometric sensing structure BSS and the edge SW1 of the flexible substrate SUB. The first display region DR1, the foldable region FR, and the second display region DR2 may be total covered by the biometric sensing region BR. The above-mentioned range of the first ratio of the area of the biometric sensing region BR to the area of the flexible substrate SUB may also be applied to other embodiments and variant embodiments of the present disclosure, which will not be redundantly repeated. According to the present disclosure, the biometric sensing region BR of the biometric sensing structure BSS occupies a relatively large area of the foldable display device 100, thus improving the function of biometric sensing. The sensing area is not limited in a small area of the foldable display device 100. Therefore, to perform the biometric sensing by the foldable display device 100 of the present disclosure may be more convenient. The types of performing the biometric sensing may be various. According to some other embodiments, at least a portion of the biometric sensing region BR extends to the display region DR. For example, at the edge SW1, a portion of the biometric sensing region BR may protrude from a portion of the display region DR, but at another edge, a portion of the biometric sensing region BR may not protrude from a portion of display region DR. In other words, the distance between the boundary of the display region DR and the edge of the flexible substrate SUB may be greater than, equal to, or smaller than the distance between the boundary of the biometric sensing structure BSS and the edge of the flexible substrate SUB in different parts of the foldable display device 100. Thus, not all of the display region DR overlaps the biometric sensing region BR.

In detail, the measurement method of the area of the biometric sensing region BR may include the following steps. As shown in FIG. 5, first, an object with imitating-fingerprint characteristic or with fingerprint characteristic can be used to touch the foldable display device 100 with multiple times, such that multiple sensing result patterns may occur on the foldable display device 100. Some of these multiple sensing result patterns may be correct sensing results, such as the sensing result patterns FA, FB, FC, FD, FE, and FF. Some other multiple sensing result patterns may be failed or incorrect sensing results, such as the sensing result patterns Fa, Fb, Fc, Fd. Second, an identify procedure is carried out to find out and determine the correct sensing result patterns FA, FB, FC, FD, FE, FF. Third, the biometric sensing region BR can be defined by the largest area enclosed by the connection lines CNL between the center points CP of the correct sensing result patterns FA, FB, FC, FD, FE, FF. If the defined boundary of the biometric sensing region BR from the third step is irregular, it is suggested to find out at least one correct sensing result per centimeter (cm) so as to define one center point CP per centimeter, in order to obtain the connection lines CNL and define the more accurate boundary of the biometric sensing region BR. In other words, the maximum distances between two adjacent center points CP of the correct sensing result patterns FA, FB, FC, FD, FE, FF in the connection lines CNL is less than or equal to 1 cm.

In addition, referring to FIG. 3, the foldable display device 100 may further include a supporting film SUF disposed in the first display region DR1, the second display region DR2, and the foldable region FR. The supporting film SUF can be attached to (or adhered onto) the flexible substrate SUB and opposite to the display layer DL. The supporting film SUF may include one or more recess portion 106 in the foldable region FR. The design of the recess portion 106 of the supporting film SUF can improve the folding performance of the foldable display device 100. In this embodiment, a ratio of an area of the biometric sensing region BR to a total area of the supporting film SUF is in a range from 1 to 1.5. The above-mentioned ratio of area can influence the sensing accuracy of the biometric sensing structure BSS. The supporting film SUF with the area meeting the above-mentioned range can provide a good supporting functionality to the biometric sensing structure BSS. If the area of the supporting film SUF is too small, it may not provide enough support and then the sensing error of the biometric sensing structure BSS may be increased.

Further referring to FIG. 6, as mentioned above, one sensing unit BSU is formed at the overlapping portion of one of the first conductive lines 102L and one of the second conductive lines 104L. In this embodiment, a spacing S1 between two adjacent sensing units BSU of the plurality of sensing units BSU in the first display region DR1 or in the second display region DR2 is less than a spacing S2 between two adjacent sensing units BSU of the plurality of sensing units BSU in the foldable region FR. In other words, the distribution density of the sensing units BSU in the first display region DR1 or the second display region DR2 is greater than the distribution density of the sensing units BSU in the foldable region FR. The distribution density means the number of units (for example, sensing units) in a given area. Specifically, in a given area, the number of sensing units BSU in the first display region DR1 or the second display region DR2 is greater than the number of sensing units BSU in the foldable region FR. Specifically, in this embodiment, the distance between two adjacent second conductive lines 104L in the first display region DR1 and the second display region DR2 is less than the distance between two adjacent second conductive lines 104L in the foldable region FR, as shown in FIG. 6, such that the spacing between two adjacent sensing units BSU in the foldable region FR is greater. In some embodiments, the distance between two adjacent first conductive lines 102L in the first display region DR1 and the second display region DR2 is less than the distance between two adjacent first conductive lines 102L in the foldable region FR. In some embodiments, both the distance between two adjacent first conductive lines 102L and the distance between two adjacent second conductive lines 104L in the foldable region FR are greater than those in the first display region DR1 and the second display region DR2. In addition, the height (or thickness) of the conductive layers (102, 104) in the first display region DR1 and in the second display region DR2 may be greater than that of the conductive layers in the foldable region FR. Taking the first conductive layer 102 as an example, the height H1 of the first conductive layer 102 (the first conductive line 102L) disposed in the first display region DR1 is greater than the height H2 of the first conductive layer 102 (the first conductive line 102L) disposed in the foldable region FR, as shown in the partial enlarged sectional views of the first conductive layer 102 in the lower part of FIG. 6 (layers between the flexible substrate SUB and the first conductive layer 102 are omitted for simplicity). For examples, the first conductive layer 102 may include a first layer 1021, a second layer 1022 and a third layer 1023 to form a composite stacking layer, wherein the three layers may include Mo/Al/Mo or Ti/Al/Ti materials, but not limited thereto. In some embodiments, the first conductive lines 102L and/or the second conductive lines 104L can respectively include a plurality of openings. When the first conductive line 102L includes multiple layers, the openings 102r may penetrate through all of the multiple layers, or may penetrate through the topmost first or two layers to expose at least one lower layer. Taking one of the first conductive lines 102L for an example, in the foldable region FR, a plurality of openings 102r penetrate through the topmost first or two layers 1023 and 1022 to expose the lower layer 1021. In detail, the openings 102r may be formed in the second layer 1022 and the third layer 1023 of the first conductive layer 102. The openings 102r may improve the folding stress distribution or release the folding stress when the foldable display device 100 is in a folded state, so as to decrease the damage possibility of the first conductive layer 102 in the folded state or in the state of being folded. As shown in FIG. 6, for the same first conductive line 102L, the openings 102r may be formed in the foldable region FR, but the portion of the first conductive line 102L in the first display region DR1 may not include openings. In some embodiments, the first conductive line 102L may also include openings in the first display region DR1 and/or the second display region DR2, as well as the foldable region FR, but the openings of the first conductive line 102L in the first display region DR1 and/or the second display region DR2 may be smaller than the openings of the first conductive line 102L in the foldable region FR. In some embodiments, the openings of the first conductive line 102L in the first display region DR1 and/or the second display region DR2 may have less distribution density than the openings of the first conductive line 102L in the foldable region FR.

In some embodiments, the conductive lines may further include curved edges and/or curved openings. For example, the second conductive line 104L disposed in the foldable region FR may include a plurality of curved openings 104r, as shown in the partial enlarged top-view of the second conductive line 104L in the right part of FIG. 6. The openings 104r can provide the function to release folding stress when the foldable display device 100 is in the folded state. The openings 104r may include a curved shape, and may be in an oval shape. Similar to the first conductive line 102L as mentioned above, when the second conductive line 104L includes multiple layers, the openings 104r may penetrate through all of the multiple layers, or may penetrate through the topmost first or two layers to expose at least one lower layer. In addition, one opening 104r may have a first distance w1 and a second distance w2 from the two adjacent edges of the second conductive line 104L in a same straight line, such as in the dotted line 500 along the direction D1, and the opening 104r has a width w3 in the same dotted line 500. In some embodiments, the relation of the first distance w1, the second distance w2, and the third distance w3 meets at least one of the following equations:

$$w3 \leq (w1 + w2)$$

$$0.2 \leq (w2 - w1)/(w1 + w2) \leq 0.6$$

$$w1 \neq w2.$$

The electronic device and foldable display device of the present disclosure are not limited by the aforementioned embodiment, and may have other different embodiments and variant embodiments. To simplify the description, the identical components in each of the following embodiments are marked with identical symbols. For making it easier to compare the difference between the embodiments, the following description will detail the dissimilarities among different embodiments and the identical features will not be redundantly described.

Figures 7, 8:
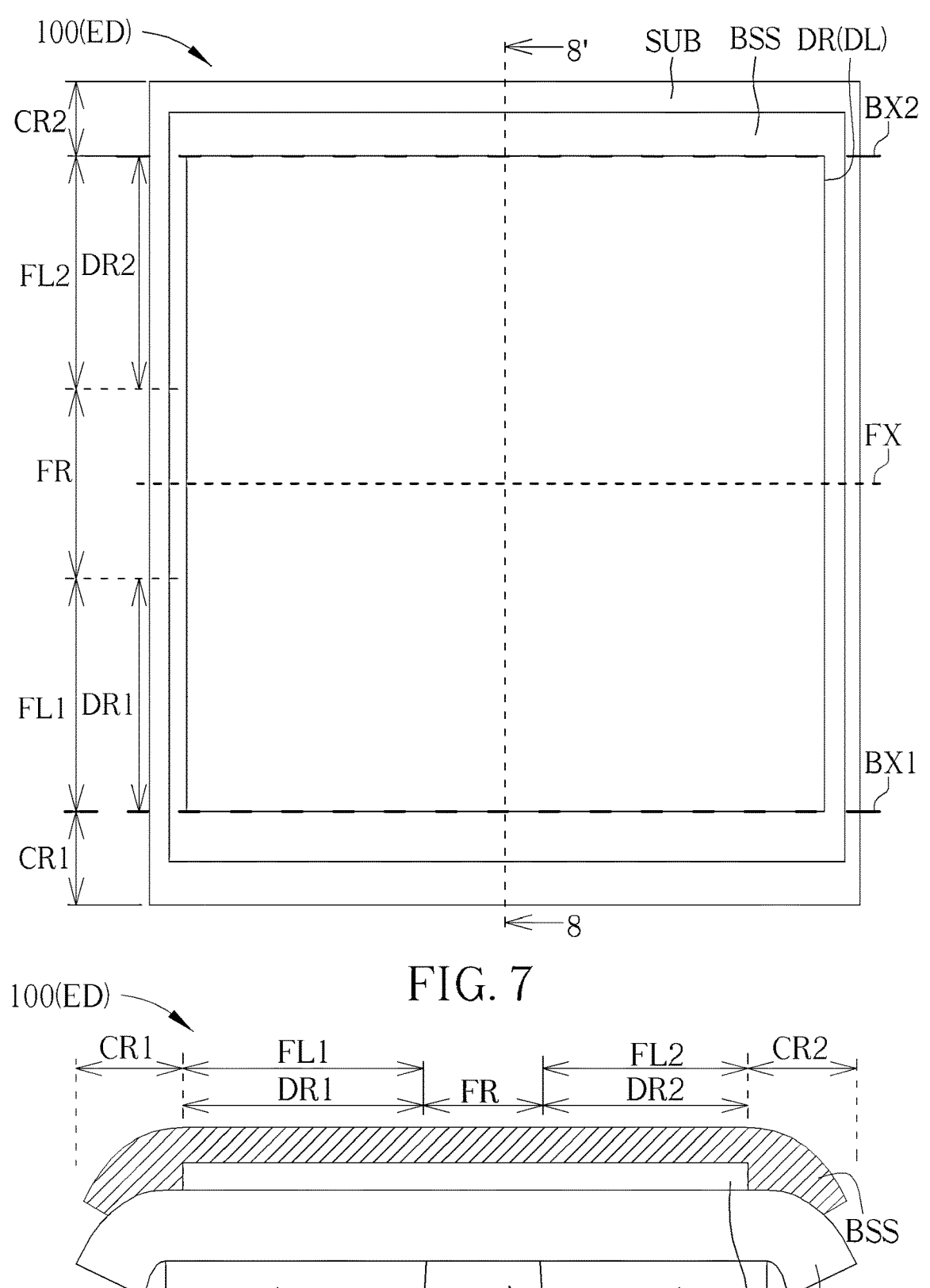
FIG. 7 is a schematic diagram of a top view of an electronic device according to a second embodiment of the present disclosure.
FIG. 8 is a schematic diagram of a sectional view of the electronic device shown in FIG. 7.

Referring to FIG. 7 and FIG. 8, FIG. 7 is a schematic diagram of a top view of an electronic device according to a second embodiment of the present disclosure, and FIG. 8 is a schematic diagram of a sectional view of the electronic device along sectional-line 8-8' shown in FIG. 7. This embodiment is mainly different from the previous embodiments in that the electronic device ED in FIG. 7 and FIG. 8 has curved surface. In detail, the flexible substrate SUB has a curvature portion CR1 and a curvature portion CR2 at the outer sides of the first flat region FL1 and the second flat region FL2 respectively. The curvature portion CR1 and the curvature portion CR2 are positioned near an edge of the flexible substrate SUB. The electronic device ED is bent along a bending axis BX1 to form the curvature portion CR1 and bent along a bending axis BX2 to form the curvature portion CR2. The biometric sensing structure BSS covers at least a portion of the curvature portion CR1 and at least a portion of the curvature portion CR2 in this embodiment. In addition, in this embodiment, the area of the display layer DL may be less than that of the biometric sensing structure BSS, and the area of the biometric sensing structure BSS may be less than that of the flexible substrate SUB. However, in some other embodiments, the areas of the display layer DL (which may indicate the display region) and the biometric sensing structure BSS may be approximately the same as the flexible substrate SUB. In still some other embodiments, the area of the display layer DL may be greater than the area of the biometric sensing structure BSS. Further, in this embodiment, the foldable display device 100 has a first supporting film SUF1 disposed in the first display region DR1 and a second supporting film SUF2 disposed in the second display region DR2. The first supporting film SUF1 and the second supporting film SUF2 are attached to the flexible substrate SUB and opposite to the display layer DL. The first supporting film SUF1 can be not connected to the second supporting film SUF2, and a recess portion 106 is formed between the first supporting film SUF1 and the second supporting film SUF2. In some embodiments, the first supporting film SUF1 can be connected to the second supporting film SUF2 in some portion in the foldable region FR (not shown in FIG. 8). The first supporting film SUF1 and the second supporting film SUF2 may have inclined sidewalls facing the recess portion 106 in this embodiment, as shown in FIG. 8. Further, a ratio of the area of the biometric sensing region of the biometric sensing structure BSS to a sum of the area of the first supporting film SUF1 and the area of the second supporting film SUF2 can be in a range from 1 to 1.5 in this embodiment.

Figures 9, 10:
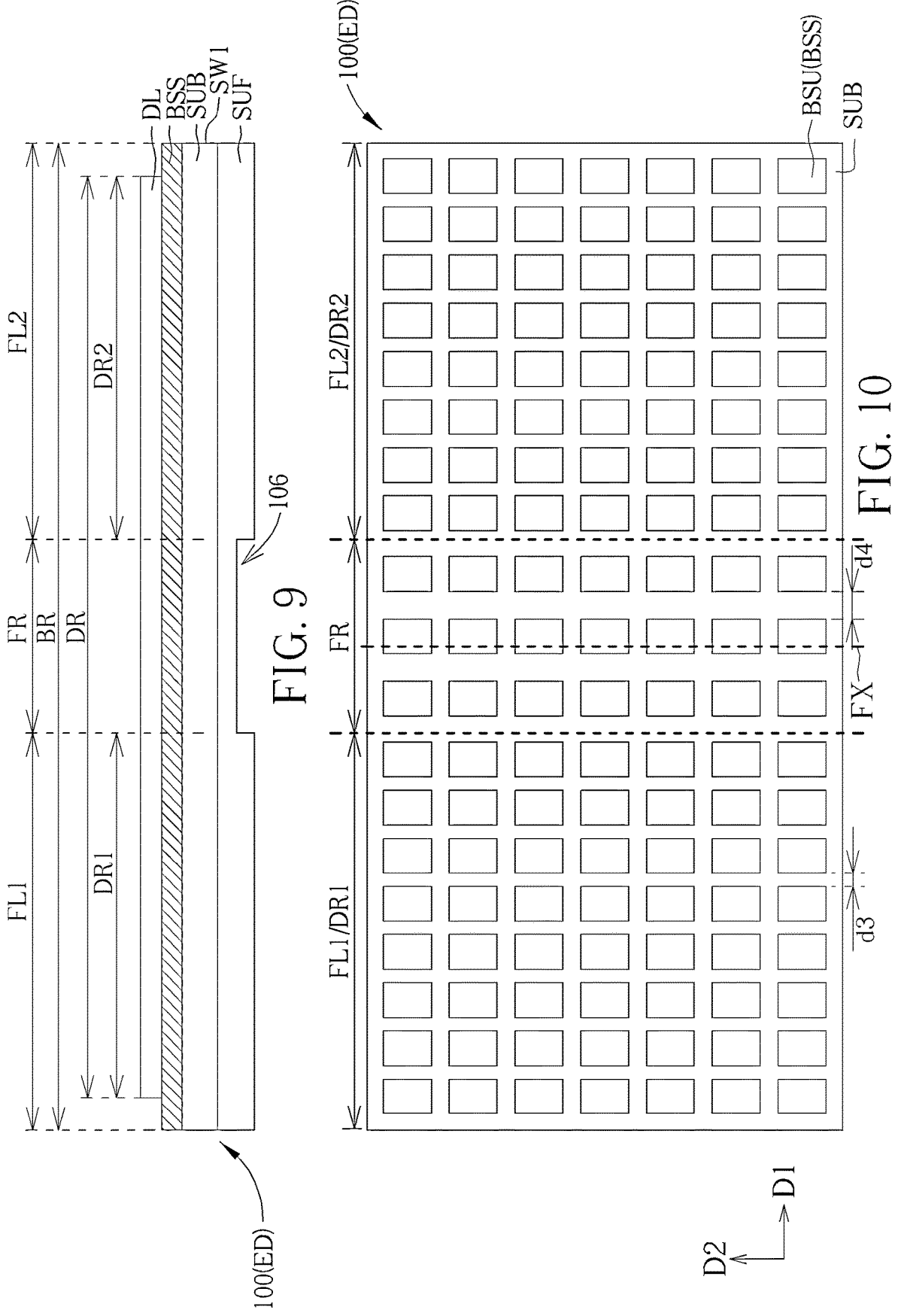
FIG. 9 is a schematic diagram of a sectional view of an electronic device according to a third embodiment of the present disclosure.
FIG. 10 is a schematic diagram of a top view of the electronic device shown in FIG. 9.
Figure 11:
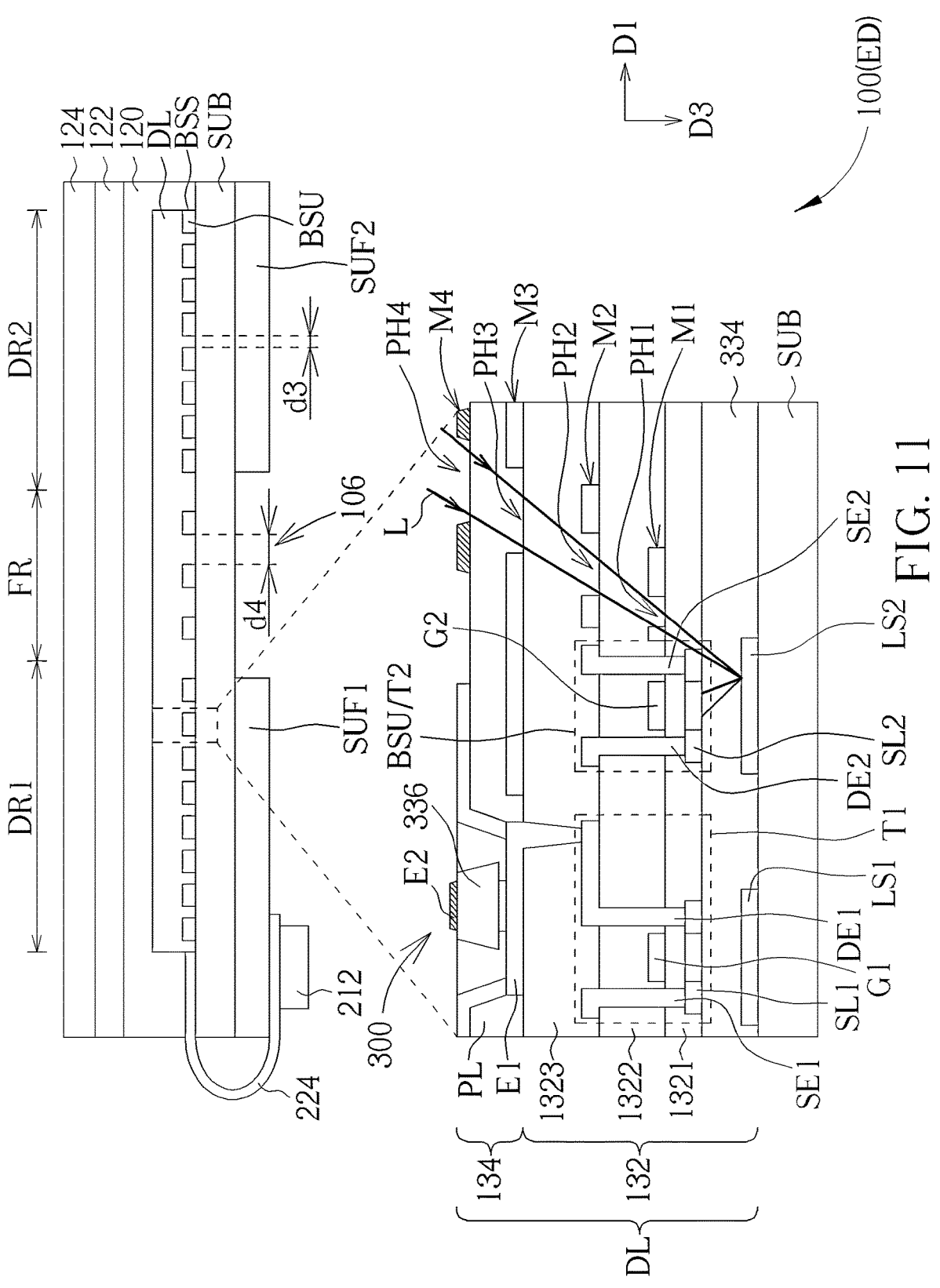
FIG. 11 is a schematic diagram of a sectional view of the electronic device shown in FIG. 10 with more detailed elements and partial enlarged illustration.

Referring to FIG. 9 to FIG. 11, FIG. 9 is a schematic diagram of a sectional view of an electronic device according to a third embodiment of the present disclosure, FIG. 10 is a schematic diagram of a top view of the electronic device shown in FIG. 9, and FIG. 11 is a schematic diagram of a sectional view of the electronic device shown in FIG. 10 with more detailed elements and partial enlarged illustration. Wherein, FIG. 10 only shows the flexible substrate SUB and the biometric sensing structure BSS and other components of the foldable display device 100 are omitted for simplifying the figure. In this embodiment, the spacing d3 along the direction D1 between two adjacent sensing units BSU in the first display region DR1 or in the second display region DR2 is less than the spacing d4 along the direction D1 between two adjacent sensing units BSU in the foldable region FR. The direction D1 can be perpendicular to the folding axis FX. In other words, the distribution density of the sensing units BSU in the first display region DR1 or in the second display region DR2 is greater than the distribution density of the sensing units BSU in the foldable region FR.

As shown in FIG. 11, the display layer DL may include a circuit layer 132 and a light emitting structure 134 disposed on the circuit layer 132. The circuit layer 132 may include a plurality of switch elements or driving elements (such as driving TFT T1) and a plurality of conductive lines. The light emitting structure 134 may include a plurality of display units 300 electrically connected to the corresponding driving elements. The driving TFT T1 for serving as the driving element of one display unit 300 may include a source electrode SE1, a drain electrode DE1, a gate electrode G1 and a semiconductor layer SL1. The biometric sensing structure BSS of this embodiment is an optical-type sensing structure, and the biometric sensing structure BSS is disposed between the display layer DL and the flexible substrate SUB. In detail, the sensing units BSU of the biometric sensing structure BSS may be embedded in the display layer DL. In other words, at least a part of the sensing unit BSU may be formed in the display layer DL. For example, the sensing units BSU may be formed with thin film transistors disposed in the display layer DL. As shown in the enlarged part in FIG. 11, the thin film transistor structure (labeled as sensor TFT T2) of one sensing unit BSU may include a gate electrode G2, a source electrode SE2, a drain electrode DE2 and a semiconductor layer SL2. The semiconductor layer SL1, gate electrode G1, source electrode SE1 and drain electrode DE1 of the driving TFT T1 for driving the display unit 300 and the semiconductor layer SL2, gate electrode G2, source electrode SE2 and drain electrode DE2 of the sensor TFT T2 of the sensing unit BSU may be formed of the same material or layer respectively. A first insulating layer 1321 may be disposed on the semiconductor layer SL2. The gate electrode G2 may be disposed on the first insulating layer 1321 and on the semiconductor layer SL2. The gate electrode G2 may be formed of a first metal layer M1 in the circuit layer 132. A second insulating layer 1322 may be disposed on the first metal layer M1. The source electrode SE2 and the drain electrode DE2 may be disposed on the second insulating layer 1322 and penetrate through the second insulating layer 1322 and the first insulating layer 1321 to contact two ends of the semiconductor layer SL2. The source electrode SE2 and the drain electrode DE2 may be formed of the same second metal layer M2 of the circuit layer 132. A planarization layer 1323 may be disposed on the second metal layer M2 and the second insulating layer 1322. For preventing ambient light from illuminating the semiconductor layers SL1 and SL2, the circuit layer 132 may include light-shielding portions LS1, LS2 between the semiconductor layer SL1 or SL2 and the flexible substrate SUB. The light-shielding portions LS1, LS2 may be formed of a metal layer, and a third insulating layer 334 may be disposed between the metal layer and the semiconductor layers SL1, SL2. Light L penetrating through the inner surface of the foldable display device 100 may be reflected by the light-shielding portion LS1 to the semiconductor layer SL2, and the semiconductor layer SL2 can receive light signal. In some embodiments, the first metal layer M1 and the second metal layer M2 may include pin holes PH1, PH2 for allowing the light L penetrating through.

The light emitting structure 134 may include a plurality of light-emitting diodes 336 serving as the display units 300, a third metal layer M3, a partition layer PL and a fourth metal layer M4. The third metal layer M3 may include an electrode E1 penetrating through the planarization layer 1323 for electrically connecting one corresponding light-emitting diode 336 to the corresponding driving TFT T1. The partition layer PL may have a cup structure for disposing the corresponding light-emitting diode 336. The fourth metal layer M4 may include another electrode E2 on the corresponding light-emitting diode 336. Also, for allowing the light L penetrating through the third metal layer M3 and the fourth metal layer M4, the third metal layer M3 and the fourth metal layer M4 may further include pin holes PH3, PH4. In a top view direction D3, one sensing unit BSU can be implemented as a thin-film transistor element (sensor TFT T2) and may be disposed at a side of one light-emitting diode 336, along the longitudinal direction D1, for sensing the light signal. Accordingly, the biometric sensing region of the biometric sensing structure BSS can be defined by the connecting lines of the outer sides of the outmost sensing units BSU, that is, by the connecting lines of the outer sides of the outmost sensor TFTs T2. Thus, the area of biometric sensing region can be defined by the area of an inner region surrounded by the connecting lines of the outer sides of the outmost sensor TFTs T2. In another aspect, the display region of the display layer DL may be defined by connecting the outer sides of the outmost light-emitting diodes 336. The structures of the display layer DL and the biometric sensing structure BSS are not limited to the structures mentioned-above. In another embodiment, the optical-type biometric sensing structure BSS may be disposed between the supporting film SUF and the flexible substrate SUB.

In this embodiment, referring to FIG. 11, a protective layer 120 may cover the display layer DL and the biometric sensing structure BSS. An over-coating adhesive 122 may be disposed on the protective layer 120 for attaching a cover layer 124 on the protective layer 120, as shown in FIG. 11. In addition, the foldable display device 100 may further include a flexible circuit board 224 for electrically connecting the biometric sensing structure BSS to a control unit 212, wherein the flexible circuit board 224 may be a flexible printed circuit (FPC) and the control unit 212 may be an integrated circuit (IC) package, but not limited thereto.

Figure 12:
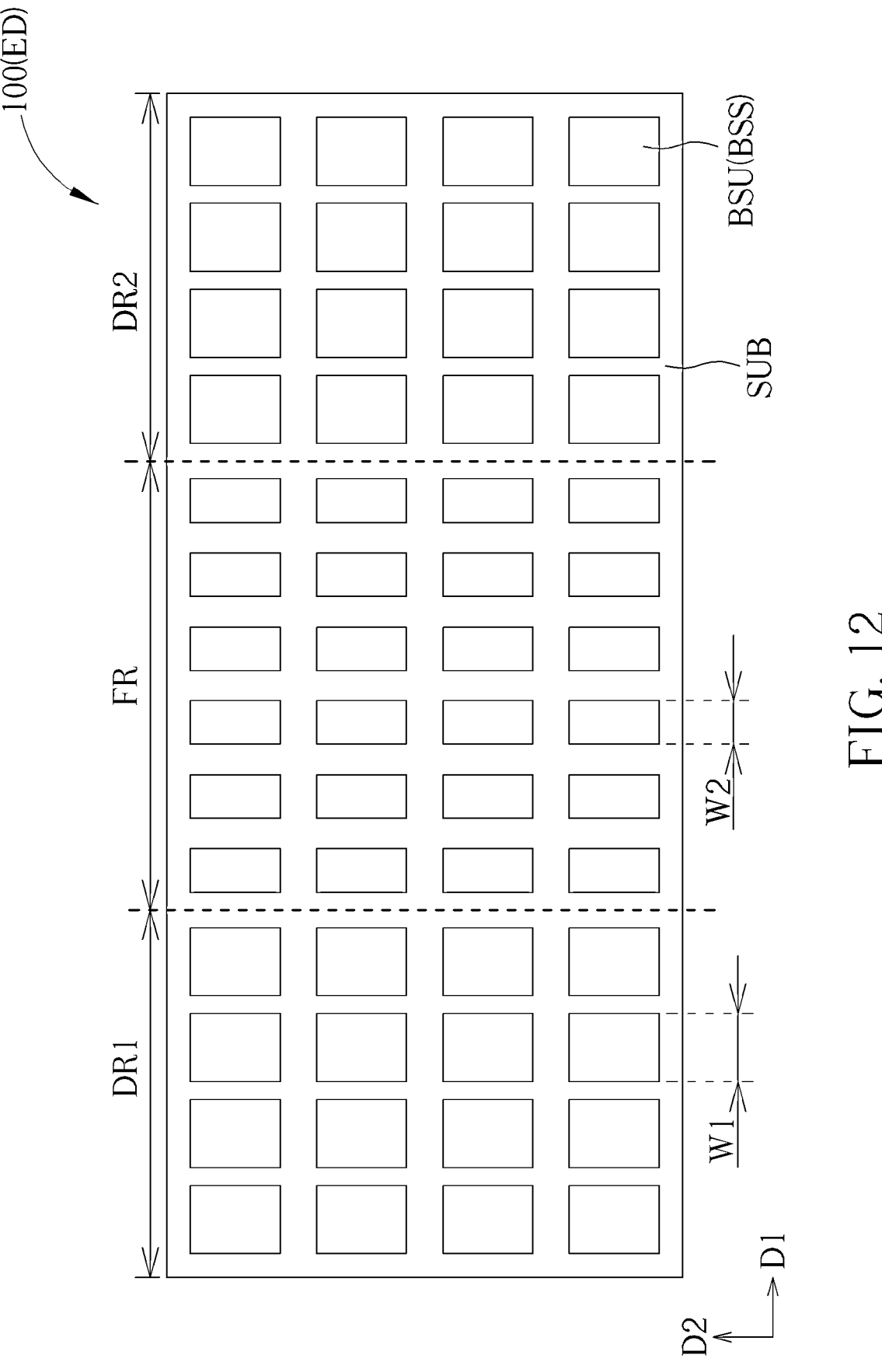
FIG. 12 is a schematic diagram of a top view of the electronic device according to a first variant embodiment of the third embodiment of the present disclosure.

Referring to FIG. 12, FIG. 12 is a schematic diagram of a top view of the electronic device according to a first variant embodiment of the third embodiment of the present disclosure. This embodiment is different form the third embodiment in that the area of the sensing units BSU disposed in the first display region DR1 and in the second display region DR2 is different from the area of the sensing units BSU disposed in the foldable region FR. In detail, the width W1 measured along the direction D1 of one of the sensing units BSU disposed in the first display region DR1 or in the second display region DR2 may be greater than the width W2 measured along the direction D1 of one of the sensing units BSU disposed in the foldable region FR. Accordingly, the area of the sensing unit BSU disposed in the first display region DR1 or in the second display region DR2 may be greater than the area of the sensing unit BSU disposed in the foldable region FR.

Figures 13, 14:
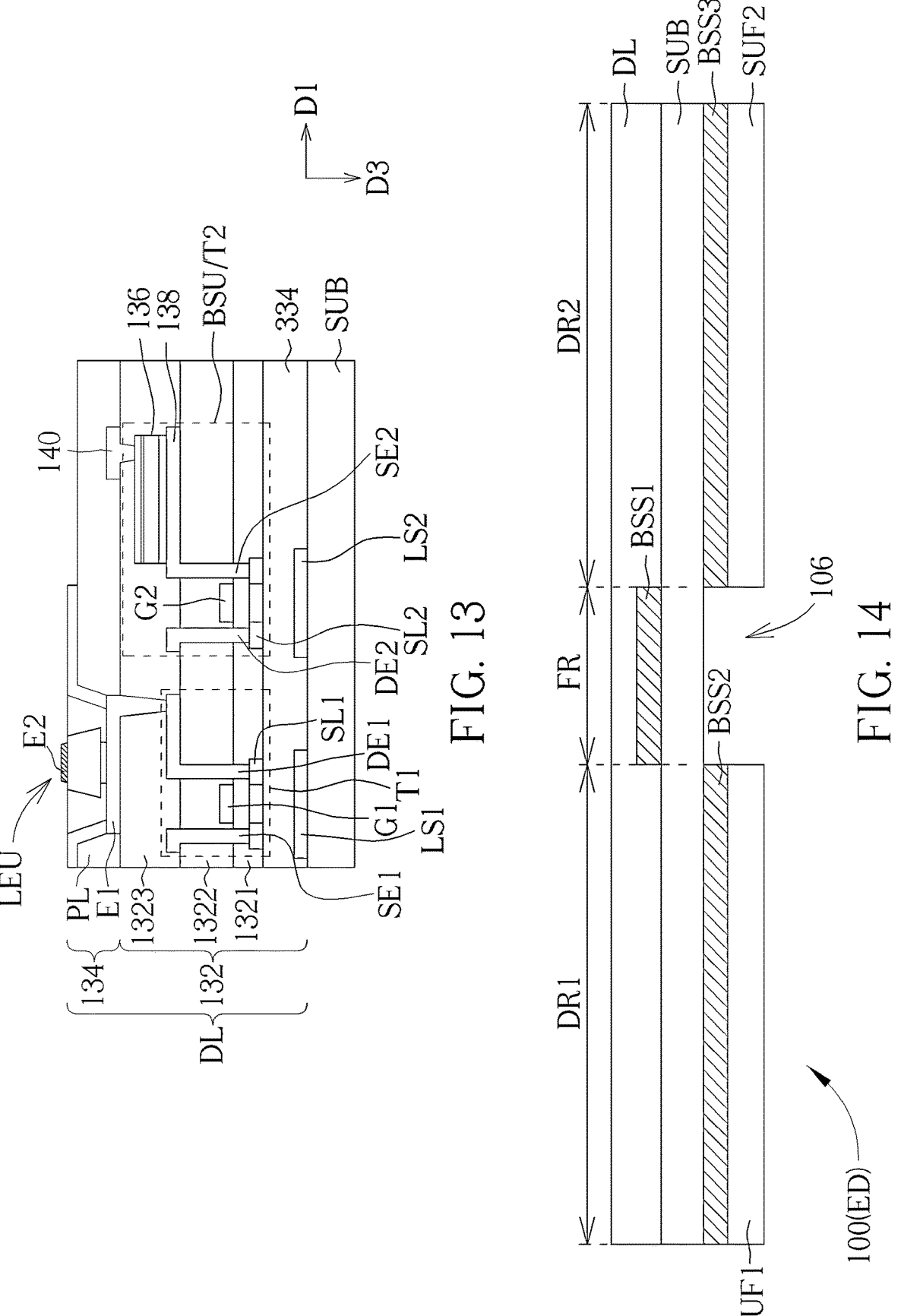
FIG. 13 is a schematic diagram of a partial enlarged sectional view of the electronic device according to a second variant embodiment of the third embodiment of the present disclosure.
FIG. 14 is a schematic diagram of a sectional view of an electronic device according to a fourth embodiment of the present disclosure.

Referring to FIG. 13, FIG. 13 is a schematic diagram of a partial enlarged sectional view of the electronic device according to a second variant embodiment of the third embodiment of the present disclosure. FIG. 13 illustrates another type of optical sensor of the sensing unit BSU. The sensing unit BSU includes a sensor TFT T2 and a diode layer, for example, a PIN layer 136. The PIN layer 136 include an N+ type semiconductor layer, an intrinsic semiconductor layer, and a P type semiconductor layer stacked sequentially, for example, stacked from bottom to top. A bottom electrode 138 positioned below the PIN layer 136 is electrically connected to the source electrode SE2 of the sensor TFT T2, and a top electrode 140 is disposed on the PIN layer 136. When light enters the PIN layer 136, it can produce current to send signals through the electrically connected thin-film transistor element.

Referring to FIG. 14, FIG. 14 is a schematic diagram of a sectional view of an electronic device according to a fourth embodiment of the present disclosure. The biometric sensing structure of this embodiment is a hybrid-type sensing structure, and it may include two or more of ultrasonic sensing structure, capacitive type sensing structure and optical type sensing structure. As shown in FIG. 14, the biometric sensing structure includes a first biometric sensing structure BSS1 disposed in the foldable region FR, a second biometric sensing structure BSS2 disposed in the first display region DR1, and a third biometric sensing structure BSS3 in the second display region DR3. The structure or type of the first biometric sensing structure BSS1 may be different from that of the second biometric sensing structure BSS2 and the third biometric sensing structure BBS3. The first biometric sensing structure BSS1 is positioned between the display layer DL and the flexible substrate SUB and may include an optical type sensor or a capacitive type sensor, but not limited thereto. The second biometric sensing structure BSS2 and the third biometric sensing structure BBS3 are positioned between the flexible substrate SUB and the supporting film SUF and may include an optical type sensor or an ultrasonic type sensor, but not limited thereto.

Figure 15:
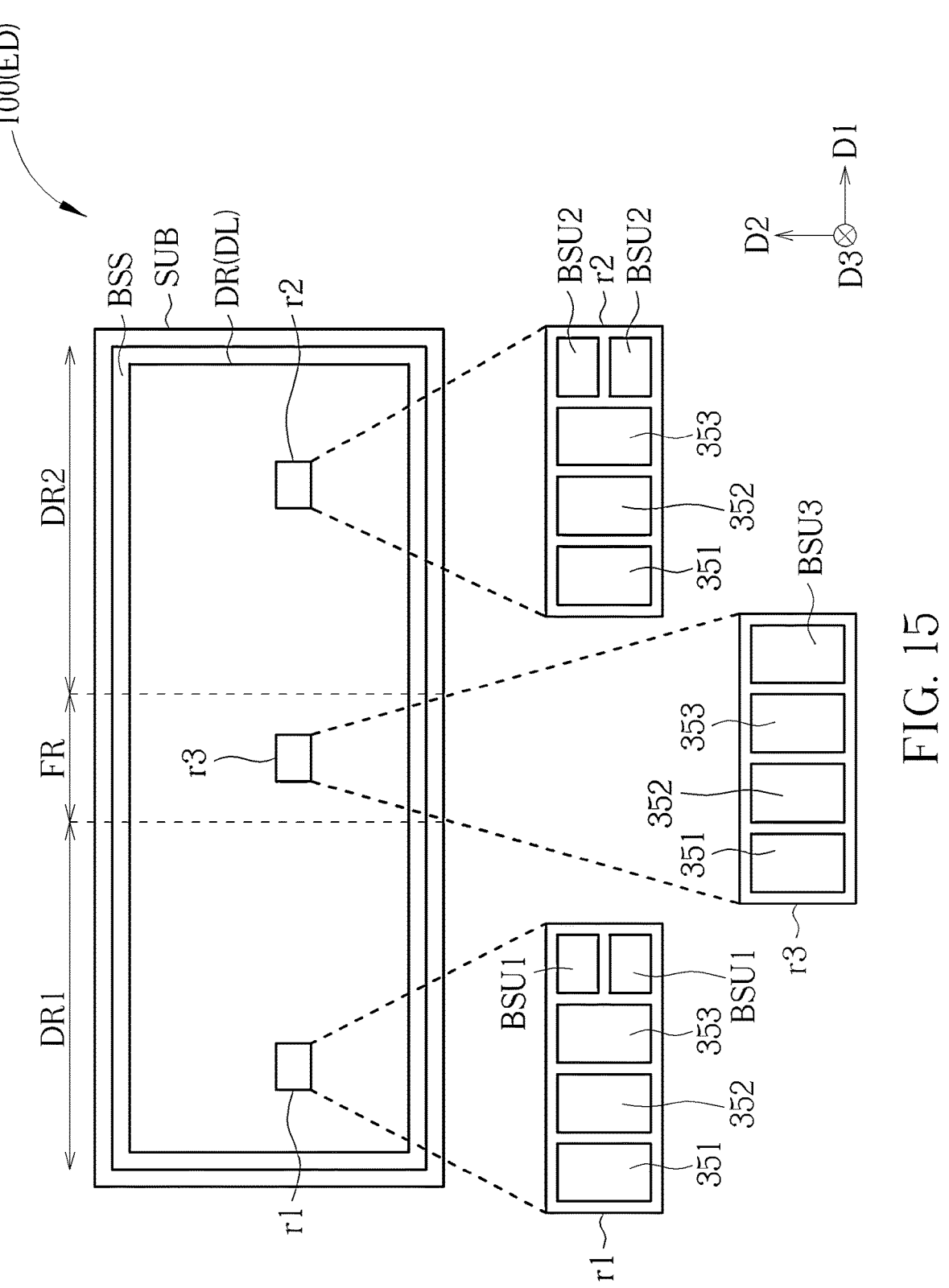
FIG. 15 is a schematic diagram of a top view of an electronic device according to a fifth embodiment of the present device.

Referring to FIG. 15, FIG. 15 is a schematic diagram of a top view in the direction D3 of the electronic device according to a fifth embodiment of the present disclosure. The arrangement of the sensing units of the biometric sensing structure BSS may be various. Partial enlargement of three regions r1, r2, r3 in the first display region DR1, the second display region DR2 and the foldable region FR are shown in the bottom part of FIG. 15. The display units 351, 352, 353 may represent three display units for producing different color lights, such as blue light, red light, and green light, but not limited thereto. In the region r1, three display units 351, 352, 353 are arranged side by side along the direction D1, two sensing units BSU1 are disposed side by side along the direction D2, and the sensing units BSU1 are both disposed at a same side of the display unit 353. That is, in the first display region DR1, the arrangement is that three display units are combined with two sensing units as a repeating unit. The similar arrangement is shown in the region r2. However, in the region r3, only one sensing unit BSU3 is disposed at a side of the display unit 353 along the direction D1. That is, in the foldable region FR, the arrangement is that three display units are combined with one sensing unit as a repeating unit. Accordingly, the sensing units in the foldable region FR have a less distribution density than the sensing units in the first display region DR1 and/or in the second display region DR2. In some embodiments, although not shown in figures, the sensing units BSU1 in the region r1 or the sensing units BSU2 in the region r2 may be disposed at a side of the three display units 351, 352, 353 along the direction D2, and the sensing units BSU3 in region r3 are positioned at a side of the display units 351, 352, 353 along the direction D1. The arrangement of the display units 351, 352, 353 and the sensing units BSU1, BSU2, BSU3 are not limited to the above description.

Figure 16:
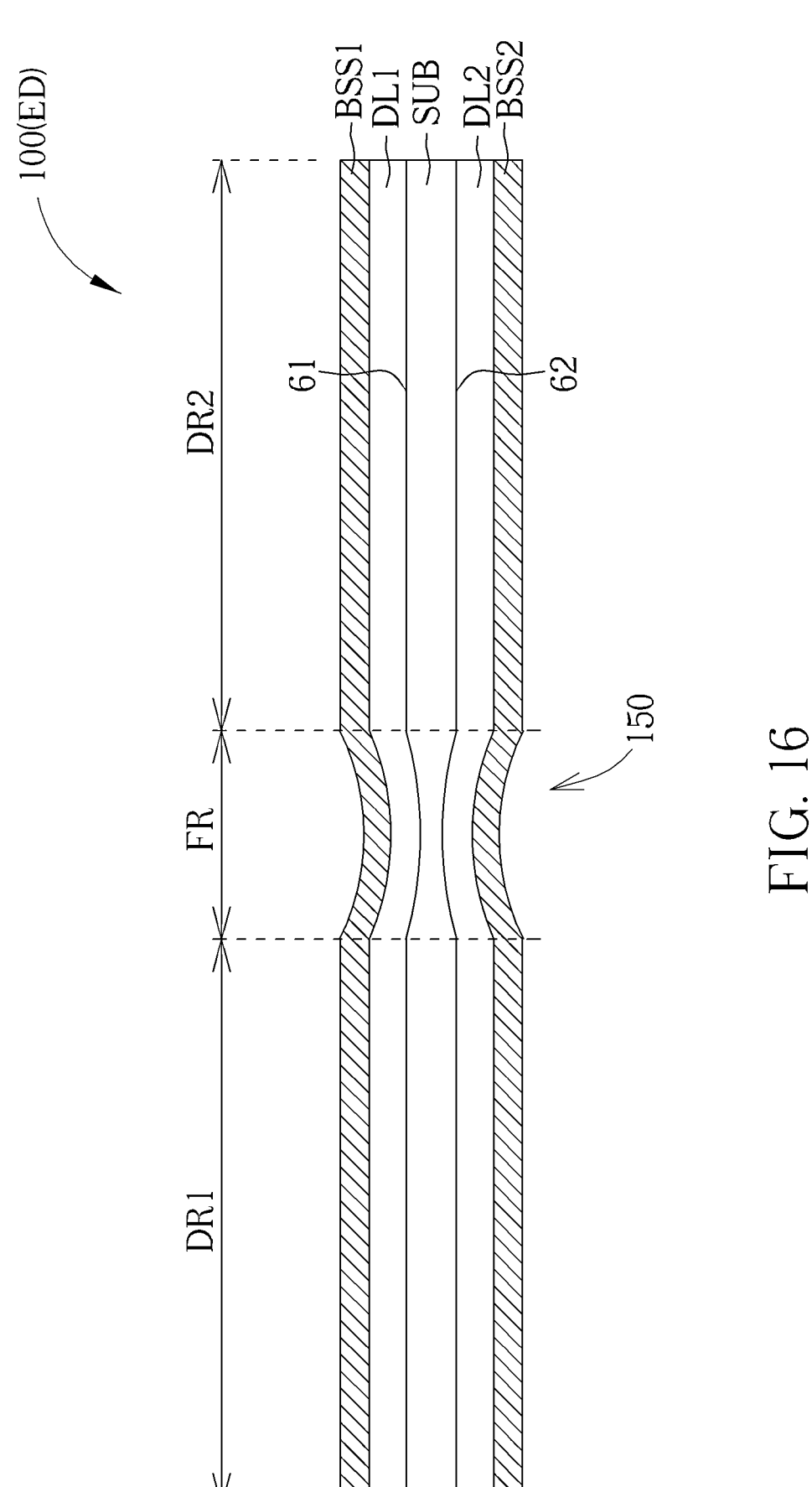
FIG. 16 is a schematic diagram of a sectional view of an electronic device according to a sixth embodiment of the present disclosure.

Referring to FIG. 16, FIG. 16 is a schematic diagram of a sectional view of an electronic device according to a sixth embodiment of the present disclosure. The electronic device ED is a foldable double-side display device that can display images at two opposite sides. The electronic device ED includes a flexible substrate SUB having a first side 61 and a second side 62 opposite to the first side 62. Further, a first display layer DL1 and a first biometric sensing structure BSS1 are disposed on the first side 61, and a second display layer DL2 and a second biometric sensing structure BSS2 are disposed on the second side 62. According to some embodiments, the first display layer DL1 can be disposed between the flexible substrate SUB and the first biometric sensing structure BSS1, and the second display layer DL2 can be disposed between the flexible substrate SUB and the second biometric sensing structure BSS2. In order to improve the folding performance and decrease the damage possibility of the elements in the foldable region FR of the electronic device ED, the electronic device ED may include a recess 150 in the foldable region FR. Specifically, the thickness of the flexible substrate SUB in the foldable region FR may be reduced compared with that in the first display region DR1. Thus, the total thickness of the flexible substrate SUB, the first and second display layers DL1, DL2, and the first and second biometric sensing structures BSS1, BSS2 may be reduced in the foldable region FR. Thus, the recess 150 is formed in the foldable region FR, which can be at one side or both sides of the foldable display device 100. In this embodiment, the first display layer DL1 and the second display layer DL2 may have the same area as the area of the first biometric sensing structure BSS1 or the area of the second biometric sensing structure BSS2, but not limited thereto.

Figure 17:
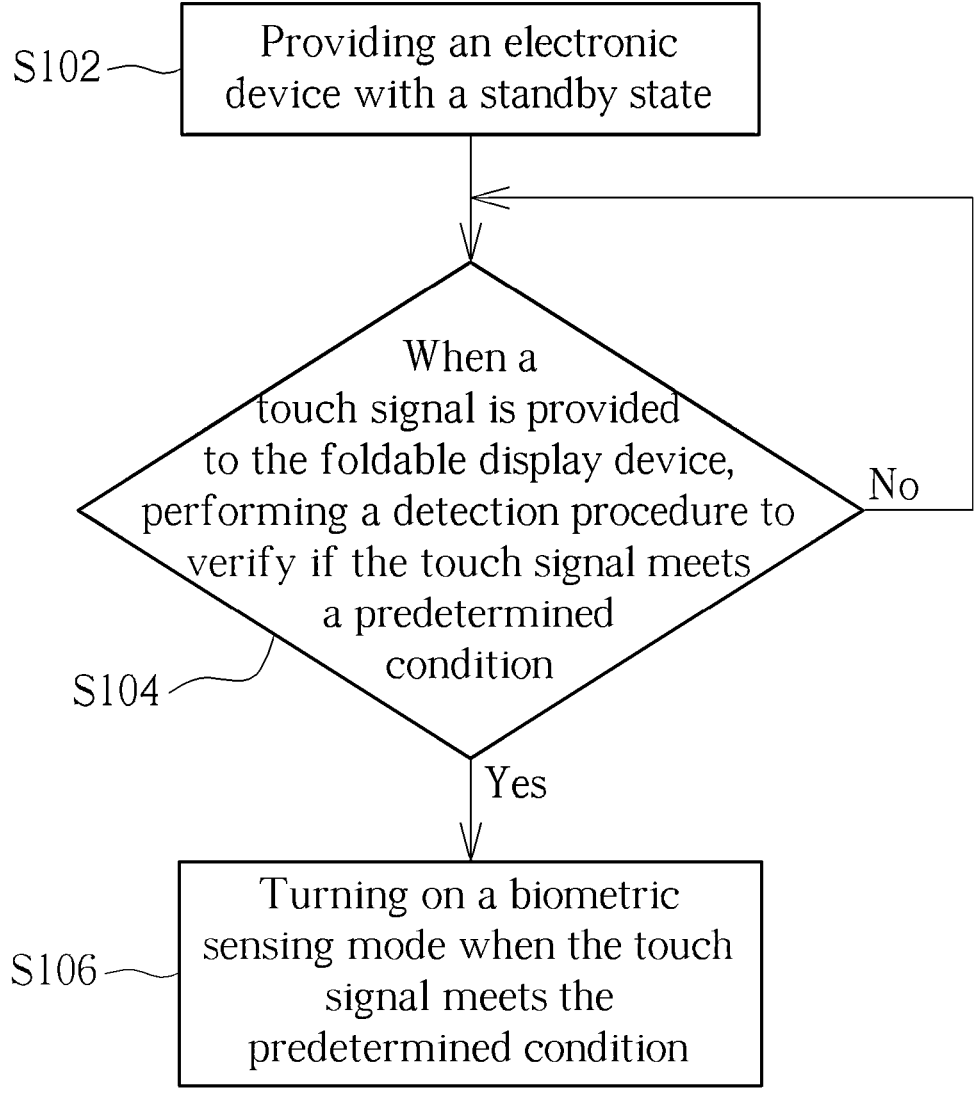
FIG. 17 is a flow chart of an operation method of an electronic device according to a seventh embodiment of the present disclosure.

Referring to FIG. 17, FIG. 17 is a flow chart of an operation method of an electronic device according to a seventh embodiment of the present disclosure. The operation method of the electronic device comprises following steps:

Step 102: Providing an electronic device with a standby state, wherein the electronic device comprises a foldable display device including a flexible substrate, a display layer disposed on the flexible substrate, and a biometric sensing structure disposed on the flexible substrate;

Step 104: When a touch signal is provided (for example, by a user) to the foldable display device, performing a detection procedure to verify if the touch signal meets a predetermined condition; and Step 106: Turning on a biometric sensing mode when the touch signal meets the predetermined condition. In other words, if the result of the verification in Step 104 is "Yes", the biometric sensing mode will be turned on; if the result of the verification in Step 104 is "No", the biometric sensing mode will not be turned on and the electronic device will be stayed in a standby state without performing biometric sensing process.

According to the present disclosure, a ratio of the area of the biometric sensing region of the biometric sensing structure to the area of the flexible substrate is in a range from 0.6 to 1, which is the "first ratio" mentioned above. In some embodiments, the predetermined condition may relate to a touching duration of the touch signal. For example, the predetermined condition may be that the touching duration is equal to or greater than 0.3 seconds and equal to or less than 3 seconds, and the biometric sensing mode will be turned on when the duration time of the touch signal (for example, provided by the user) is in the above-mentioned range. In some embodiments, the predetermined condition may relate to a touching area. For example, the predetermined condition may be that the touching area is greater than 50 mm$^2$, and the biometric sensing mode will be turned on when the touching area of the touch provided by the user is greater than 50 mm$^2$. In some other embodiments, the predetermined condition may relate to an operation state of a specific application stored in the electronic device. If the specific application stored in the electronic device is turned on, the predetermined condition is met and then the biometric sensing mode will be turned on.

According to the present disclosure, in the foldable display device, the biometric sensing structure occupies a large ratio (0.6 to 1) based on the area of the flexible substrate. The biometric sensing structure can be disposed in the first display region, the second display region, and the foldable region. The biometric sensing performance may be improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device having a first region and a second region adjacent to the first region, wherein the electronic device comprises:

a supporting film comprising an opening disposed in the first region;

a flexible substrate and an integrated circuit unit, wherein at least a portion of the flexible substrate and the integrated circuit unit respectively correspond to opposite sides of the supporting film; and a sensing structure electrically connected to the integrated circuit unit, wherein in a sectional view of the electronic device, the sensing structure comprises a plurality of conductive lines, a distance between two adjacent ones of the plurality of conductive lines in the first region is different from a distance between other two adjacent ones of the plurality of conductive lines in the second region, and wherein the two adjacent ones of the plurality of conductive lines are overlapped with the opening of the supporting film.

2. The electronic device of claim 1, wherein the flexible substrate has a curvature portion.

3. The electronic device of claim 1, wherein the opening penetrates the supporting film from a top surface of the supporting film to a bottom surface of the supporting film.

4. The electronic device of claim 1, further comprising a plurality of display units disposed on the flexible substrate, wherein at least a portion of the plurality of display units is located in the first region.

5. The electronic device of claim 4, wherein at least another portion of the plurality of display units is located in the second region.

6. The electronic device of claim 4, wherein the plurality of display units comprise organic light-emitting diodes.

7. The electronic device of claim 4, wherein one of the plurality of conductive lines is located between two adjacent ones of the plurality of display units in a top view of the electronic device.

* * * * *